(12) United States Patent
Wang et al.

(10) Patent No.: US 9,685,553 B2
(45) Date of Patent: Jun. 20, 2017

(54) GENERATING TENSILE STRAIN IN BULK FINFET CHANNEL

(71) Applicant: GLOBALFOUNDRIES INC., Grand Cayman (KY)

(72) Inventors: Yun-Yu Wang, Poughquag, NY (US); Shogo Mochizuki, Clifton Park, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/745,547

(22) Filed: Jun. 22, 2015

(65) Prior Publication Data

US 2016/0372598 A1 Dec. 22, 2016

(51) Int. Cl.
*H01L 29/78* (2006.01)
*H01L 29/66* (2006.01)

(52) U.S. Cl.
CPC ...... *H01L 29/7848* (2013.01); *H01L 29/6656* (2013.01); *H01L 29/66795* (2013.01); *H01L 29/785* (2013.01)

(58) Field of Classification Search
CPC ............ H01L 29/7848; H01L 29/6655; H01L 29/66795
See application file for complete search history.

(56) References Cited

U.S. PATENT DOCUMENTS

| 7,015,469 | B2 | 3/2006 | Wang et al. | |
|---|---|---|---|---|
| 9,219,152 | B2* | 12/2015 | Wu | H01L 29/165 |
| 2013/0043507 | A1 | 2/2013 | Wu et al. | |

OTHER PUBLICATIONS

Wang, Y.Y., et al.—"Variable Magnification Dual Lens Electron Holography for Semiconductor Junction Profiling and Strain Mapping"—Ultramicroscopy, vol. 124, (2013), pp. 117-129.
Wang, Y.Y., et al.—"Dual-Lens Electron Hologaphy for Junction Profiling and Strain Mapping of Semiconductor Devices"—Microscopy Today, vol. 22, No. 03, (2014), pp. 28-35.
Wang, Y.Y., et al.—"Nanoscale Strain Distributions in Embedded SiGe Semiconductor Devices Revealed by Precession Electron Diffractio and Dual Lens Dark Field Electron Holography", Applied Physics Letters 106 (2015) p. 042104.

* cited by examiner

*Primary Examiner* — Tran Tran
(74) *Attorney, Agent, or Firm* — Yuanmin Cai; Hoffman Warnick LLC

(57) ABSTRACT

Embodiments of the present invention provide a method of forming fin-type transistors. The method includes forming a finFET structure having a fin channel region underneath a gate structure, and a source region and a drain region directly adjacent to the fin channel region at two opposing sides of the gate structure; and subjecting the source region and the drain region to a compressive strain; thereby causing the source region and the drain region to exert a tensile strain to the fin channel region. A finFET transistor formed thereby is also provided, which includes a channel region of fin shape covered by a gate on top thereof; a source next to a first end of the channel region on a first side of the gate; and a drain next to a second end of the channel region on a second side of the gate, wherein the source and drain are made of epitaxially grown silicon-germanium (SiGe) having a Ge concentration level of at least 50% atomic percentage covered with silicon cap.

11 Claims, 12 Drawing Sheets

GENERATING TENSILE STRAIN IN BULK FINFET CHANNEL

FIELD OF THE INVENTION

The present invention relates generally to the field of semiconductor device manufacturing. In particular it relates to a method of generating tensile strain in the channel region of n-type bulk finFET transistors, and structures associated therewith.

BACKGROUND

With constant evolution of manufacturing processes and equipment tools, various types and/or shapes of structures of semiconductor devices have been developed so far with constant improving performance and/or specialized functionalities. Taking semiconductor transistors as an example, there are regular planar-type field-effect-transistors (FETs) as well as recently developed fin-type field-effect-transistors (finFETs). Furthermore, among finFETs, there are silicon-on-insulator (SOI) based finFETs and bulk finFETs. On the other hand, from device functionality standpoint, there are p-type transistors and n-type transistors that are characterized by the type of charge careers that the transistors employ. For example, there are p-type bulk finFETs and n-type bulk finFETs.

It is also known in the art that performance of a transistor generally improves with the right type of strain being present in the channel region of the transistor. For example, compressive strain is in general favorably used in a p-type transistor and tensile strain is in general favorably used in an n-type transistor in order to improve mobility of careers in the channel. In a traditional planar-type FET, as an example, a stress-liner (either compressive or tensile) may be applied to regions of the transistor to achieve the above goal of creating strain in the channel region. However, there has been no effective way of applying stress to a fin-type bulk field-effect-transistor or finFET. In particular, it is known to be a challenging task to apply tensile stress to the channel region of an n-type bulk finFET.

BRIEF SUMMARY OF EMBODIMENTS

Embodiments of present invention provide a method of forming n-type finFET transistors. In one embodiment, the method includes forming a finFET structure having a fin channel region underneath a gate structure, and a source region and a drain region directly adjacent to the fin channel region at two opposing sides of the gate structure; and subjecting the source region and the drain region to a compressive stress; thereby causing the source region and the drain region to exert a tensile stress to the fin channel region.

In one embodiment, forming the finFET structure includes epitaxially growing fully relaxed silicon-germanium (SiGe) at the two opposing sides of the fin channel region to form the source region and the drain region, wherein the SiGe of the source region and the drain region has a Ge concentration level of at least 50% in atomic percentage.

In another embodiment, epitaxially growing the fully relaxed SiGe includes forming the source region and the drain region by the SiGe to have stacking faults and dislocations, and using the Ge concentration level to control amount of the stacking faults and dislocations inside the source region and the drain region.

According to one embodiment, forming the finFET structure includes covering a fin on a substrate with the gate structure; forming sidewall spacers adjacent to sidewalls of the gate structure; and forming the fin channel region by removing portions of the fin that are not covered by the gate structure and the sidewall spacers.

In one embodiment, subjecting the source region and the drain region to the compressive stress includes epitaxially growing a silicon cap layer on top of and covering the source region and the drain region, wherein the silicon cap layer has a lattice constant that is smaller than that of the source region and the drain region.

In another embodiment, the silicon cap layer has a thickness ranging from about 5 nm to about 30 nm, causing the source region and the drain region to exert a tensile stress to and result in a tensile strain of at least 0.7% in the fin channel region.

In yet another embodiment, growing the silicon cap layer covering the source region and the drain region causes the source region and the drain region to become stressed source and drain with a compressive strain of at least −1.8%.

Embodiment of present invention also provides a semiconductor device. The semiconductor device includes a channel region of fin shape covered by a gate on top thereof; a source next to a first end of the channel region on a first side of the gate; and a drain next to a second end of the channel region on a second side of the gate, wherein the source and drain are made of epitaxially grown silicon-germanium (SiGe) having a Ge concentration level of at least 50% in atomic percentage.

BRIEF DESCRIPTION OF THE DRAWINGS

The present invention will be understood and appreciated more fully from the following detailed description of preferred embodiments, taken in conjunction with the accompanying drawings of which.

Figure 1A:
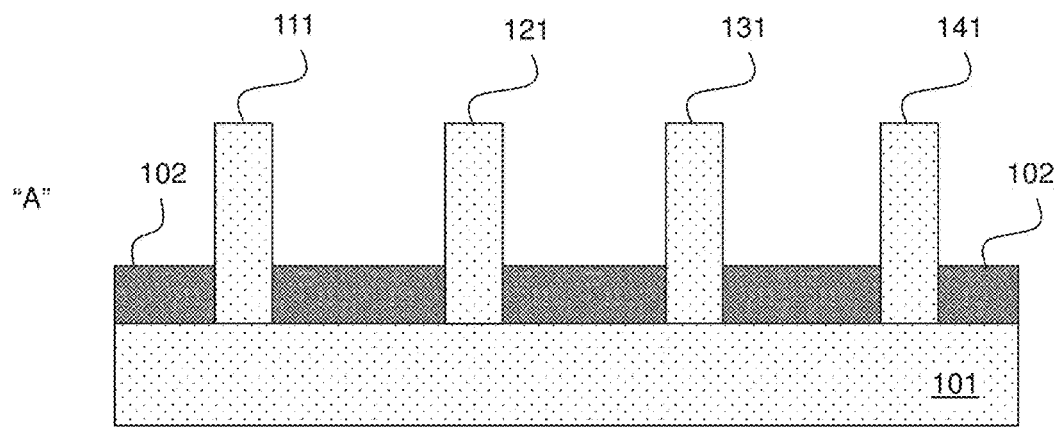
FIGS. 1(a) and 1(b) are demonstrative illustrations of a step of a method of manufacturing a semiconductor device having one or more n-type bulk finFETs according to an embodiment of present invention.

It will be appreciated that for the purpose of simplicity and clarity of illustration, elements in the drawings have not necessarily been drawn to scale. For example, dimensions of some of the elements may be exaggerated relative to those of other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the present invention.

Figure 1B:
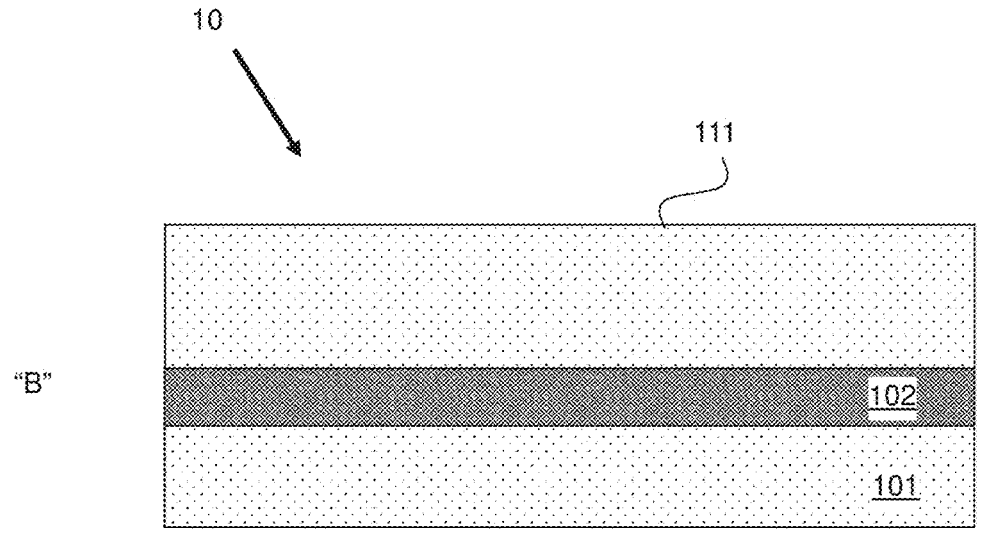

FIG. 1(a) and FIG. 1(b) are demonstrative illustrations of a step of a method of manufacturing a semiconductor device having one or more n-type bulk finFETs according to an embodiment of present invention. More specifically, FIG. 1(a) is a side view of the device under manufacturing, wherein the device is looked at along a direction of the fins that are formed at the top or top portion of a substrate of the device. The fins are demonstratively illustrated as extending into and/or out of the paper in FIG. 1(a). FIG. 1(b) is a front view of the device under manufacturing wherein the device is looked at along a direction perpendicular to the direction of the fins, which are demonstratively illustrated as extending in parallel to the paper in FIG. 1(b). Similarly, drawings of FIGS. 2(a)-7(b) and FIGS. 11(a)-11(b) demonstratively illustrates the device at different manufacturing stages or steps and, similar to FIG. 1(a) and FIG. 1(b), with "(a)" referring to side view and "(b)" referring to front view of the device.

Figure 6A:
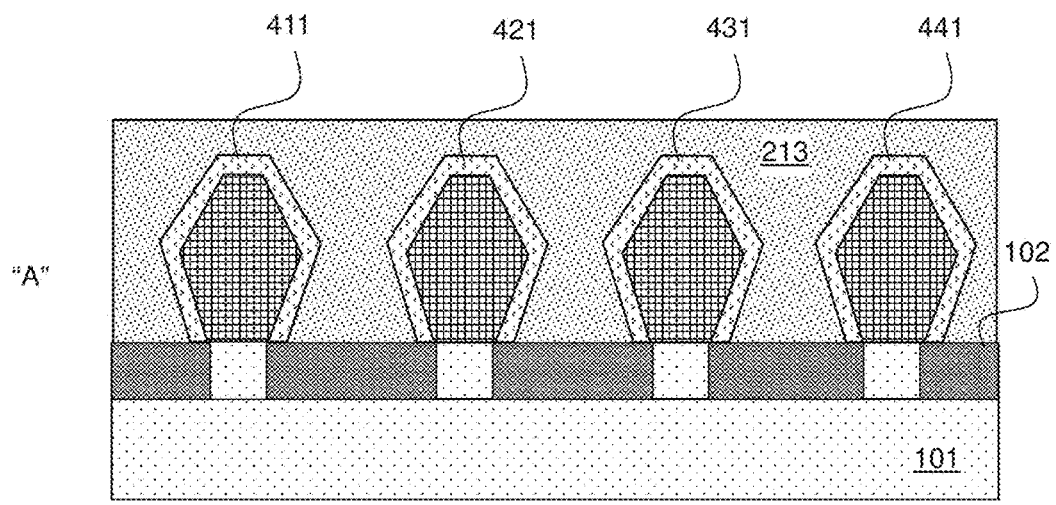
FIGS. 6(a) and 6(b) are demonstrative illustrations of a step of a method of manufacturing a semiconductor device having one or more n-type bulk finFETs, following the step illustrated in FIGS. 5(a) and 5(b), according to an embodiment of present invention.
Figure 6B:
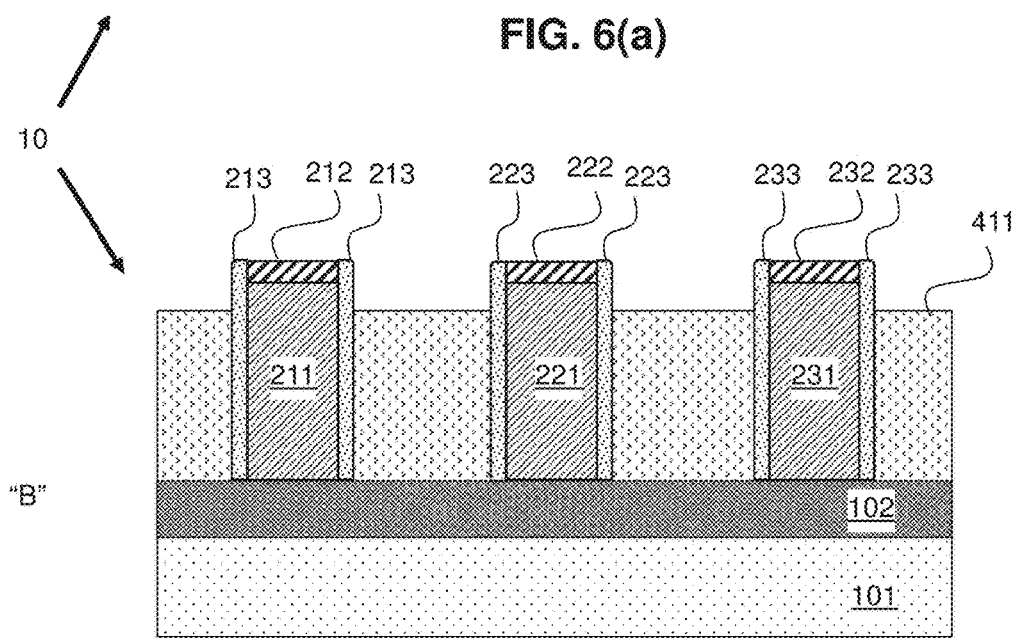
Figure 7A:
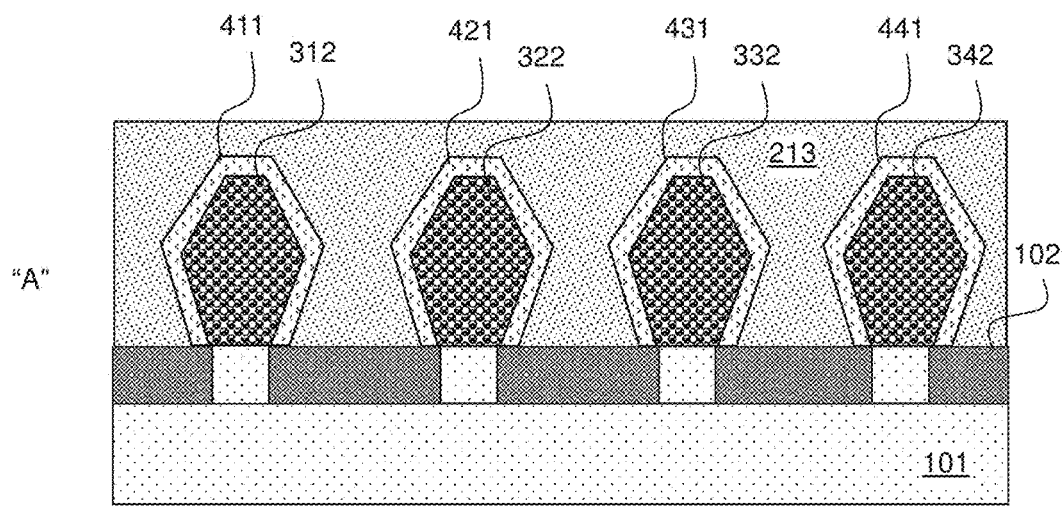
FIGS. 7(a) and 7(b) are demonstrative illustrations of a step of a method of manufacturing a semiconductor device having one or more n-type bulk finFETs, following the step illustrated in FIGS. 6(a) and 6(b), according to an embodiment of present invention.
Figure 7B:
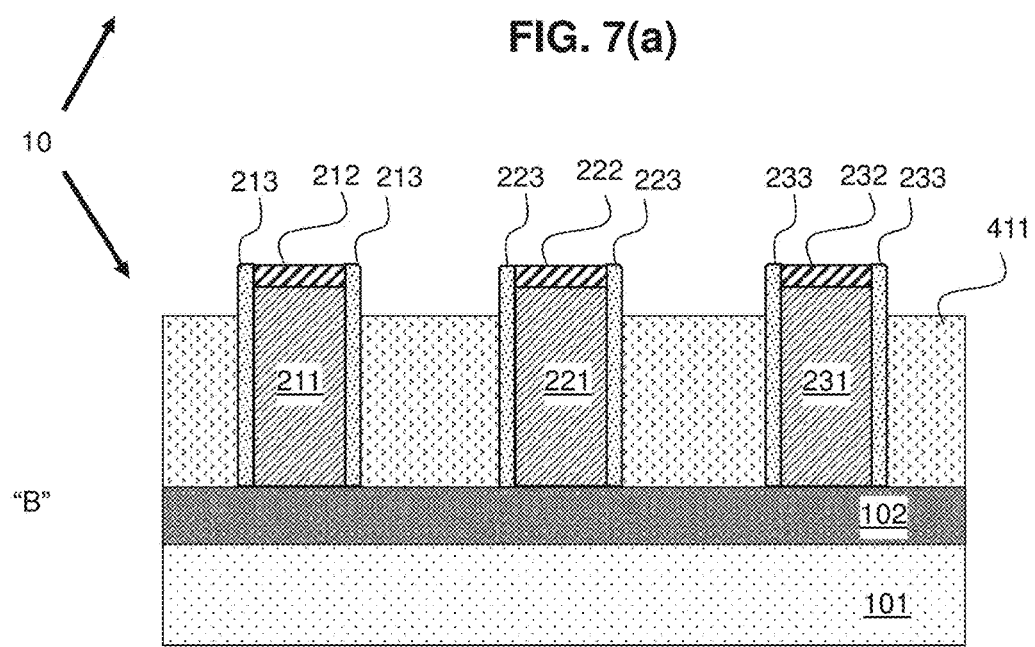
Figure 8:
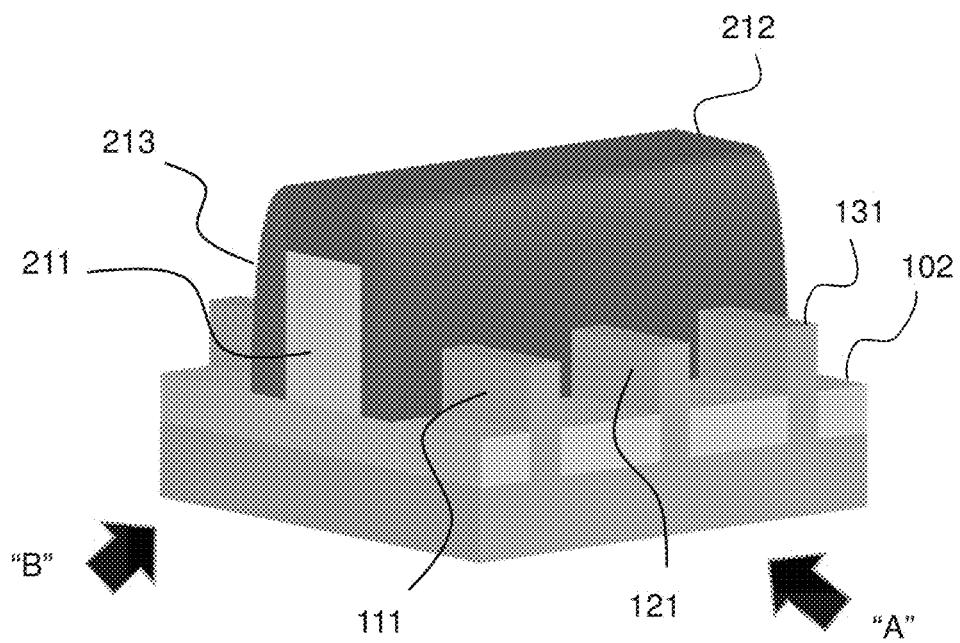
FIG. 8 is a perspective view of a step of a method of manufacturing a semiconductor device having one or more n-type bulk finFETs, which closely resembles the step demonstratively illustrated in FIGS. 3(a) and 3(b)
Figure 9:
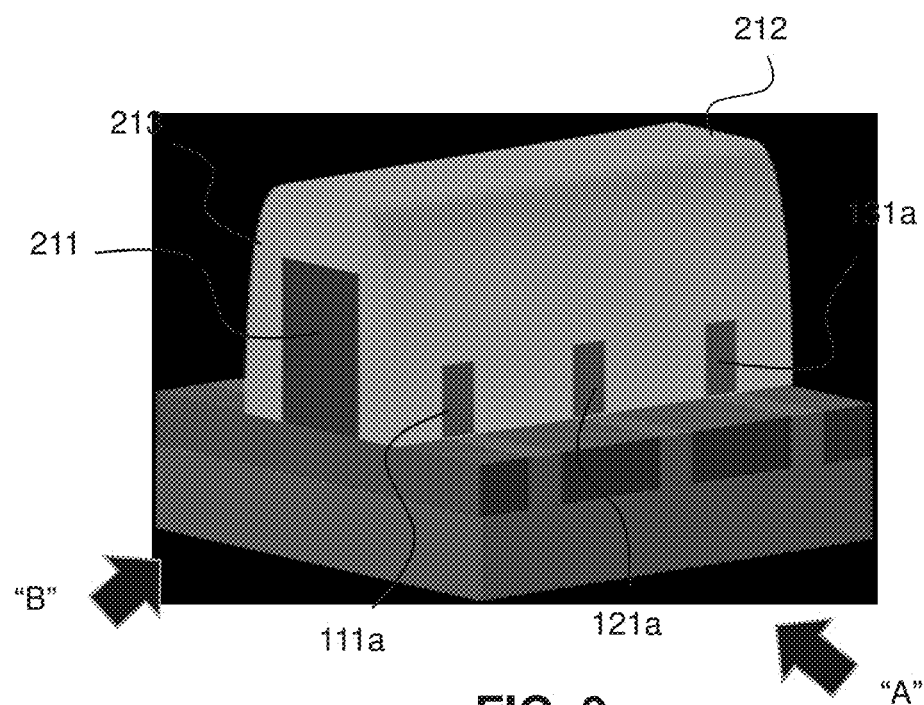
FIG. 9 is a perspective view of a step of a method of manufacturing a semiconductor device having one or more n-type bulk finFETs, which closely resembles the step demonstratively illustrated in FIGS. 4(a) and 4(b)
Figure 10:
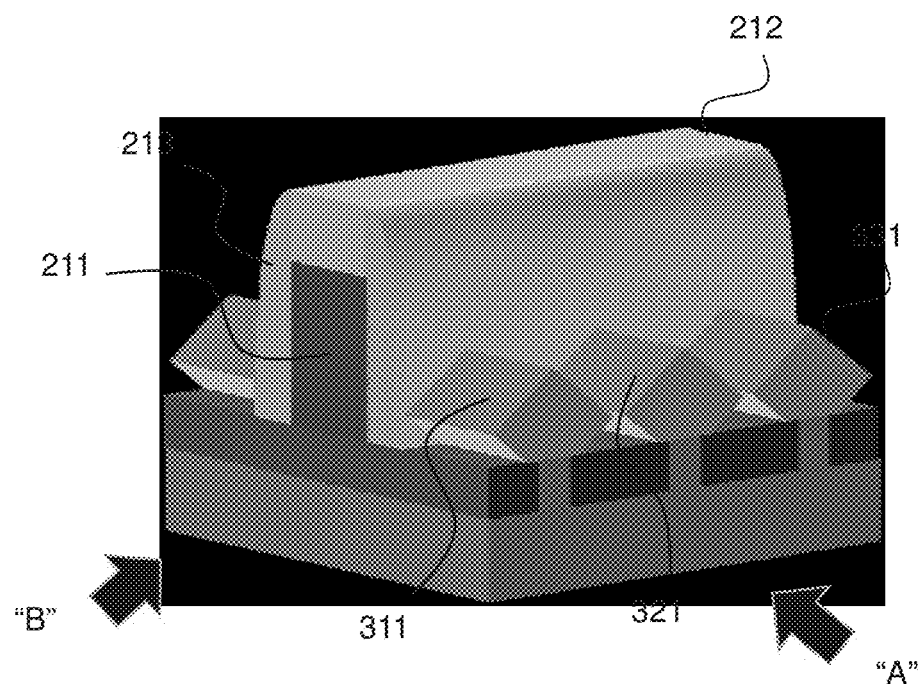
FIG. 10 is a perspective view of a step of a method of manufacturing a semiconductor device having one or more n-type bulk finFETs, which closely resembles the step demonstratively illustrated in FIGS. 5(a) and 5(b)
Figure 11A:
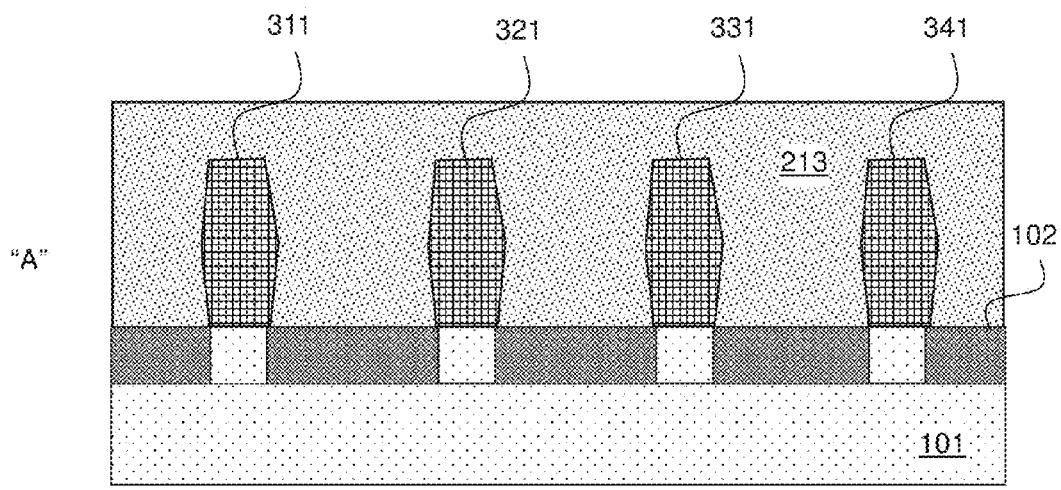
FIGS. 11(a) and 11(b) are demonstrative illustrations of a step of a method of manufacturing a semiconductor device having one or more n-type bulk finFETs, following the step illustrated in FIGS. 4(a) and 4(b), according to another embodiment of present invention.
Figure 11B:
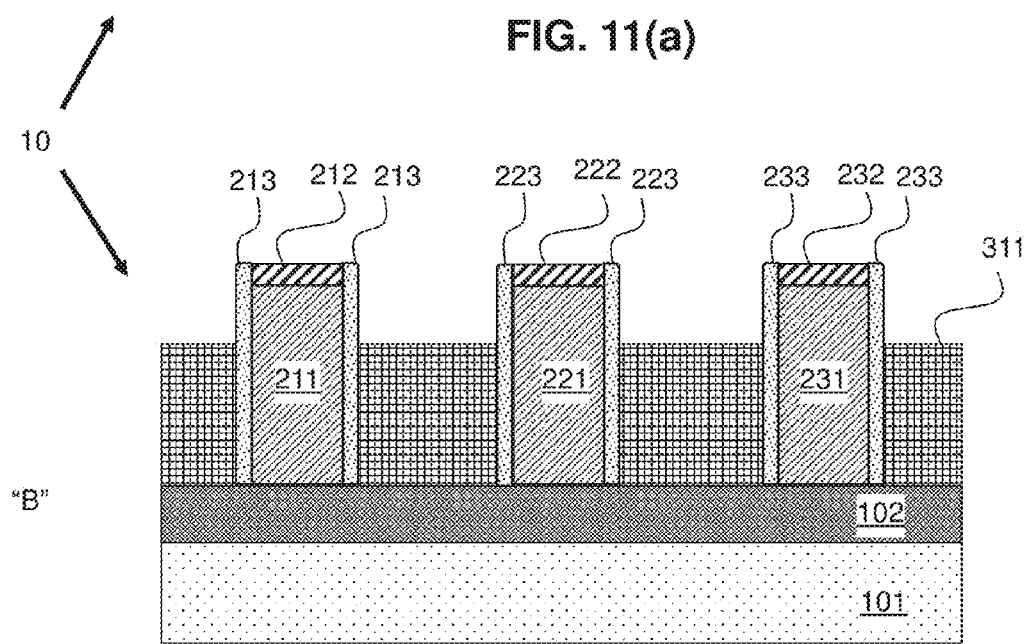

In addition, to further help comprehension of drawings FIGS. 1(a)-7(b), some perspective views of the device at different manufacturing stages are illustratively provided in FIG. 8, FIG. 9 and FIG. 10. More specifically, FIG. 8 is an illustrative perspective view of the device corresponding closely to a step illustrated in FIGS. 3(a) and 3(b); FIG. 9 is an illustrative perspective view of the device corresponding closely to a step illustrated in FIGS. 4(a) and 4(b); and FIG. 10 is an illustrative perspective view of the device corresponding closely to a step illustrated in FIGS. 5(a) and 5(b).

According to one embodiment, a method of present invention includes providing, preparing, or supplying a substrate 101 upon which one or more n-type bulk finFET transistors, collectively referred to hereinafter as semiconductor device 10, may be formed. Substrate 101 may be a semiconductor substrate of bulk silicon (Si), doped silicon, or silicon-germanium (SiGe), to list a few non-limiting examples of possible substrate materials. In the below description, for simple description without losing generality, substrate 101 is presumed to be a bulk silicon substrate. However, a person skilled in the art would appreciate that the description provided below may similarly be applied to situations where different substrate materials are used.

In one embodiment, substrate 101 may already have one or more fins formed therein such as, for example, fin 111, 121, 131, and 141 as being demonstratively illustrated in side view of FIG. 1(a). In another embodiment, fins 111, 121, 131, and 141 may have been formed on top of substrate 101 with a material that is same as or different from substrate 101. In the below description, for easy reference purpose, numeral 101 is used to refer to the substrate or a portion of substrate that is below fins 111, 121, 131, and 141.

As being illustrated in FIGS. 1(a) and 1(b), following the formation of fins 111, 121, 131, and 141, a layer of insulating material 102 may be deposited at least on portions of substrate 101 that are exposed and not covered by fins 111, 121, 131, and 141. Insulating layer 102 may be a TEOS oxide (silicon-oxide) layer or a layer of other suitable dielectric or insulating material that is used to provide electrical insulation from underneath semiconductor substrate 101, for devices or functional portions of devices formed on top thereof. Hereinafter, layer 102 may be referred to, from time to time, as an oxide layer without losing its generality for ease of reference.

Figure 2A:
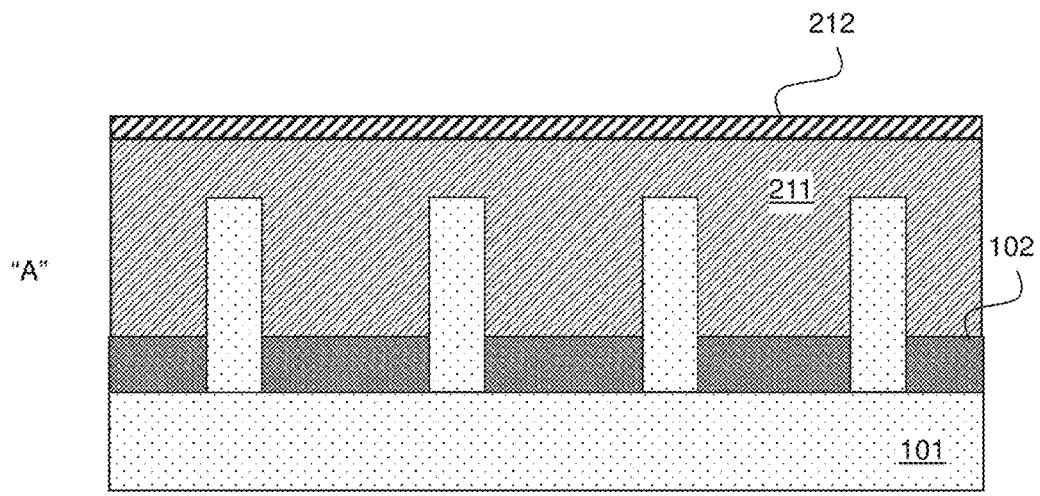
FIGS. 2(a) and 2(b) are demonstrative illustrations of a step of a method of manufacturing a semiconductor device having one or more n-type bulk finFETs, following the step illustrated in FIGS. 1(a) and 1(b), according to an embodiment of present invention.
Figure 2B:
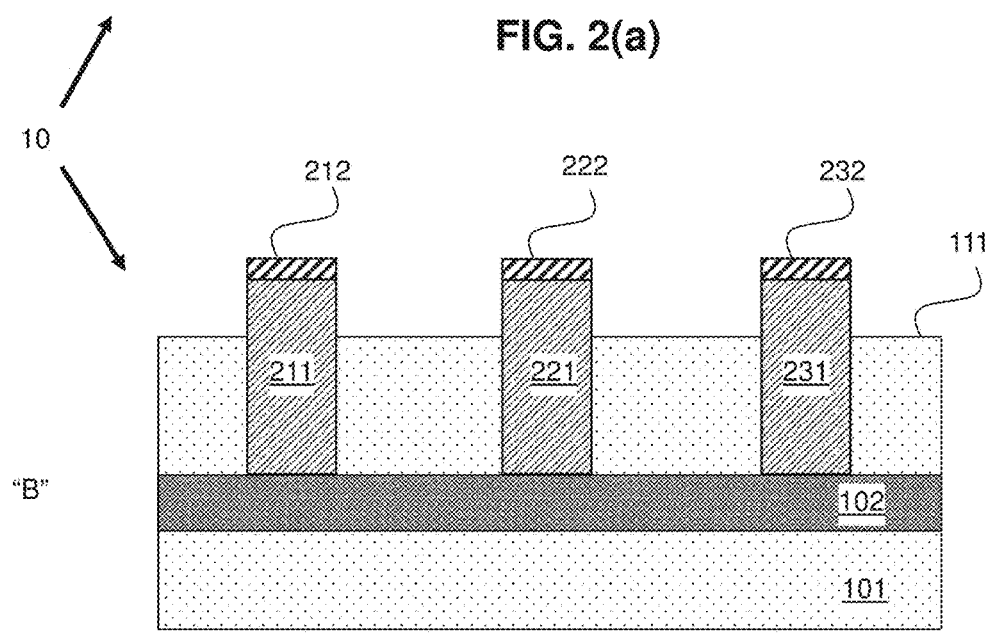

FIGS. 2(a) and 2(b) are demonstrative illustrations of a step of a method of manufacturing a semiconductor device having one or more n-type bulk finFETs, following the step illustrated in FIGS. 1(a) and 1(b), according to an embodiment of present invention. More particularly, one embodiment of present invention includes forming one or more gates or gate structures, such as gate structures 211, 221, and 231 over the one or more fins or fin structures 111, 121, 131, and 141. Gate structures 211, 221, and 231 may be formed through, for example, depositing a layer of gate material covering fins 111, 121, 131, and 141 as well as oxide layer 102; depositing a hard mask layer on top of the gate material layer; creating a gate pattern that includes gate masks 212, 222, and 232, for example, in the hard mask layer through for example a lithographic patterning process; and finally transforming the layer of gate material underneath the hard mask layer into gate structures 211, 221, and 231 through a directional and selective etching process.

More specifically, in transforming the layer of gate material into gate structures 211, 221, and 231, portions of the gate material that are not covered by gate masks 212, 222, and 232 may be etched away through, for example, a reactive-ion-etching (RIE) process. The RIE process may be made or designed to be selective to materials of both the fins 111, 121, 131, and 141 and the oxide layer 102. Consequently, the etching process leaves only gate materials that are directly underneath the gate masks 212, 222, and 232 remaining on top of oxide layer 102, and in areas not covered by gate masks the etching stops at underneath oxide layer 102 as well as at fin structure 111, 121, 131, and 141 by virtue of etch selectivity. In one embodiment, the gate structures 211, 221, and 231 may be formed such that a longitudinal direction of the gate structures is made perpendicular to the direction of the fin structures 111, 121, 131, and 141.

Figure 3A:
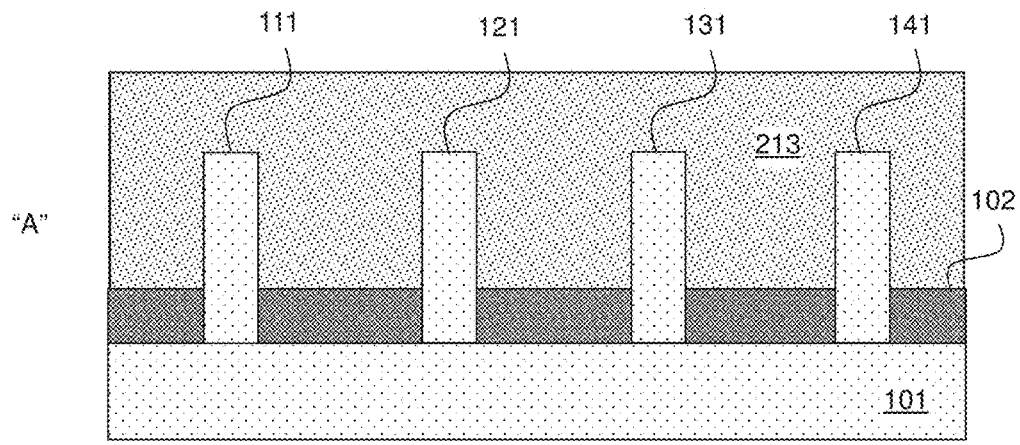
FIGS. 3(a) and 3(b) are demonstrative illustrations of a step of a method of manufacturing a semiconductor device having one or more n-type bulk finFETs, following the step illustrated in FIGS. 2(a) and 2(b), according to an embodiment of present invention.
Figure 3B:
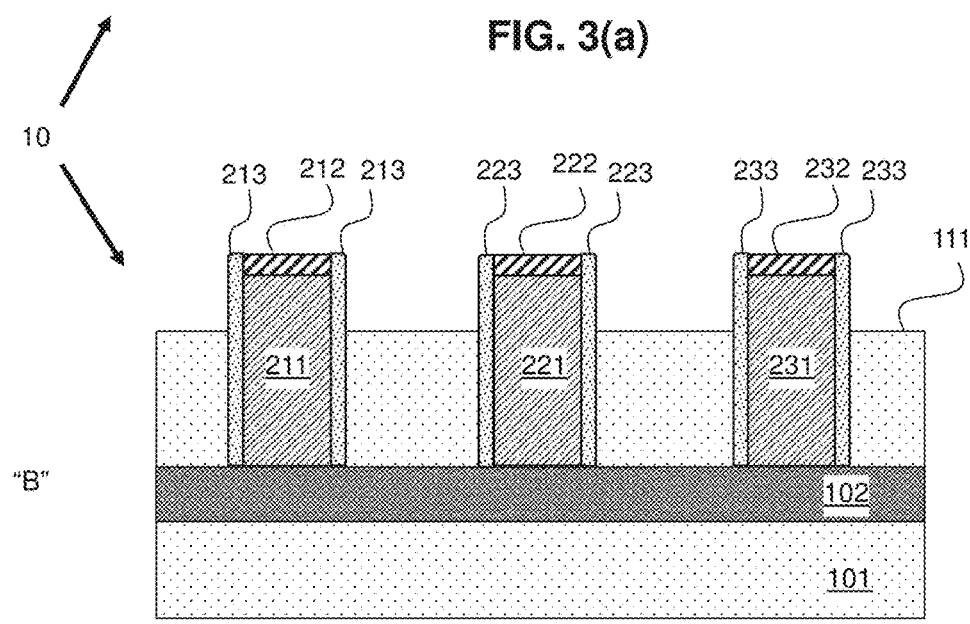

FIGS. 3(a) and 3(b) are demonstrative illustrations of a step of a method of manufacturing a semiconductor device having one or more n-type bulk finFETs, following the step illustrated in FIGS. 2(a) and 2(b), according to an embodiment of present invention. More specifically, sidewall spacers such as spacers 213, 223, and 233 may be formed directly next to the two opposing sidewalls of each gate structures 211, 221, and 231. Spacers 213, 223, and 233 may be formed through, for example, first depositing a conformal layer of dielectric material, such as nitride or oxide, covering the gate structures 211, 221, and 231, including sidewalls and gate masks 212, 222, and 232 on top thereof. The conformal dielectric layer may also cover the previously exposed oxide layer 102 between the gate structures. A directional etching process is then applied to remove portions of the conformal dielectric layer that are on top of the gate masks and on top of oxide layer 102. The above deposition and etching process eventually leaves only a portion of the conformal dielectric layer next to sidewalls of the gate structures 211, 221, and 231. In the meantime, at least due to height difference, little or no conformal dielectric layer may be left at the sidewall of the fins. If necessary, other techniques may be used to remove any remaining dielectric material at the sidewalls of the fins.

It is to be noted here that embodiments of present invention are not limited in the above aspect and sidewall spacers 213, 223, and 233 may be made by employing other suitable techniques currently existing or future developed. In addition, sidewall spacers 213, 223, and 233 may be made to have a thickness, such as for example from about 2 nm to about 10 nm, that may be suitable for device performance by providing a proper distance/separation between source/drain and gate of the finFET under manufacturing.

An illustrative perspective view of the semiconductor device manufactured by the step shown above in FIGS. 3(a) and 3(b) may be found in FIG. 8 which demonstratively illustrates fins 111, 121, 131, gate structure 211, sidewall spacers 213, gate mask 212 and oxide layer 102 that separates the n-type finFET manufactured on top thereof from underneath semiconductor substrate 101.

Figure 4A:
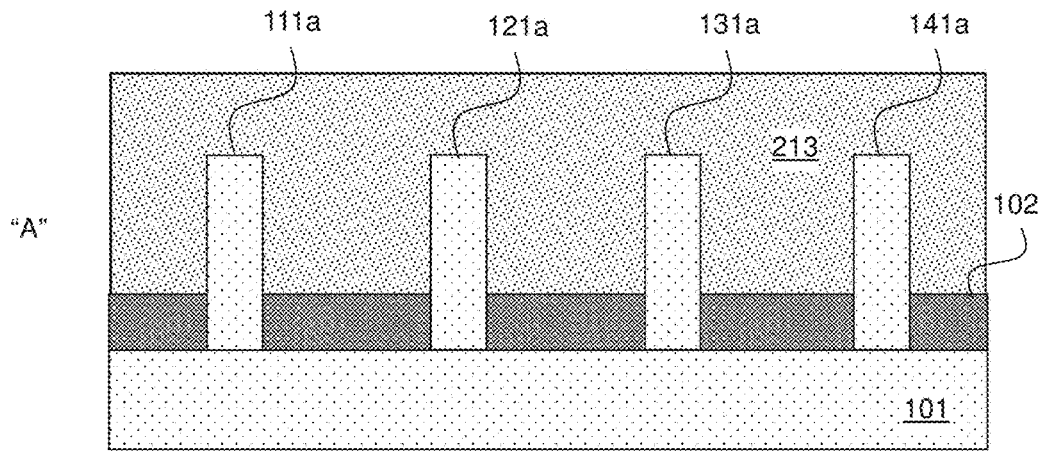
FIGS. 4(a) and 4(b) are demonstrative illustrations of a step of a method of manufacturing a semiconductor device having one or more n-type bulk finFETs, following the step illustrated in FIGS. 3(a) and 3(b), according to an embodiment of present invention.
Figure 4B:
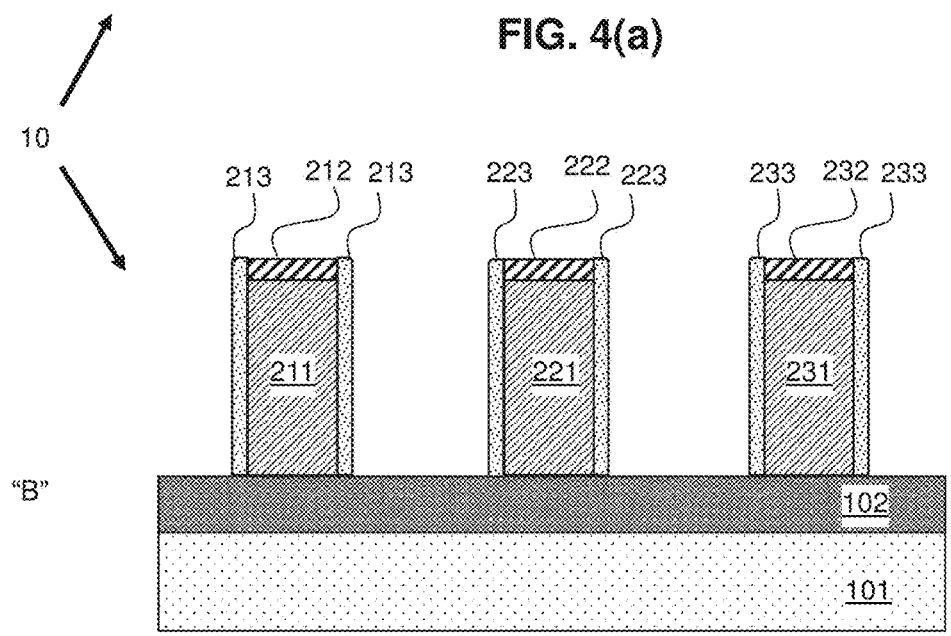

FIGS. 4(a) and 4(b) are demonstrative illustrations of a step of a method of manufacturing a semiconductor device having one or more n-type bulk finFETs, following the step illustrated in FIGS. 3(a) and 3(b), according to an embodiment of present invention. For example, after forming spacers 213, 223, and 233 next to sidewalls of gate structures 211, 221, and 231, certain portions of fins 111, 121, 131, and 141 may be removed or etched away. More specifically, portions or sections of fins 111, 121, 131, and 141 that are between gate structures 211, 221, and 231 and thus are not covered by gate structures 211, 221, and 231 nor covered by sidewall spacers 213, 223, and 233 may be removed, for example, through a selective etching process although other removal processes may be used as well.

In particular, any etching process that is selective to the material of both sidewall spacers 213, 223, and 233, which may be nitride or oxide in material, and oxide layer 102 may be employed to selectively remove the above mentioned portions of the fins 111, 121, 131, and 141 that are silicon in material. More specifically, the removal process may remove a substantial portion or an entire portion of the silicon fins that is above the level of oxide layer 102, and in some embodiment may etch slightly below the level of oxide layer 102. The removal process may also remove a substantial portion or an entire portion of the silicon fins outside the sidewall spacers, thereby exposing vertical cross-sections of the fins 111, 121, 131, and 141 at the sidewall spacers as well as horizontal cross-sections at the level of oxide layer 102. In one embodiment, the cross-sections of the fins take a rectangular shape.

As being demonstratively illustrated in FIG. 4(b), portions of fin 111 (and fins 121, 131, and 141) between gate structures 211 and 221 and between gate structures 221 and 231 may have been etched away and removed. Here, it is to be understood that fins 111a, 121a, 131a, and 141a, as being demonstratively illustrated in FIG. 4(a), are actually exposed cross-sections of the fins 111, 121, 131, and 141 at the sidewall surface of spacer 213 of gate structure 211, after portions of the fins that are in front of spacer 213 (and thus not covered by spacer 213) have been removed, even though the drawing may demonstratively appear to be similar to that in FIG. 3(a).

An illustrative perspective view of the semiconductor device manufactured by the step shown above in FIGS. 4(a) and 4(b) may be found in FIG. 9 which demonstratively illustrates that portions of fins 111, 121, 131 have been removed or etched away, exposing cross-sections 111a, 121a, and 131a at a surface coplanar with the surface of sidewall spacer 213. It also illustrates exposed cross-sections of the fins at a surface coplanar with the top surface of oxide layer 102.

Figure 5A:
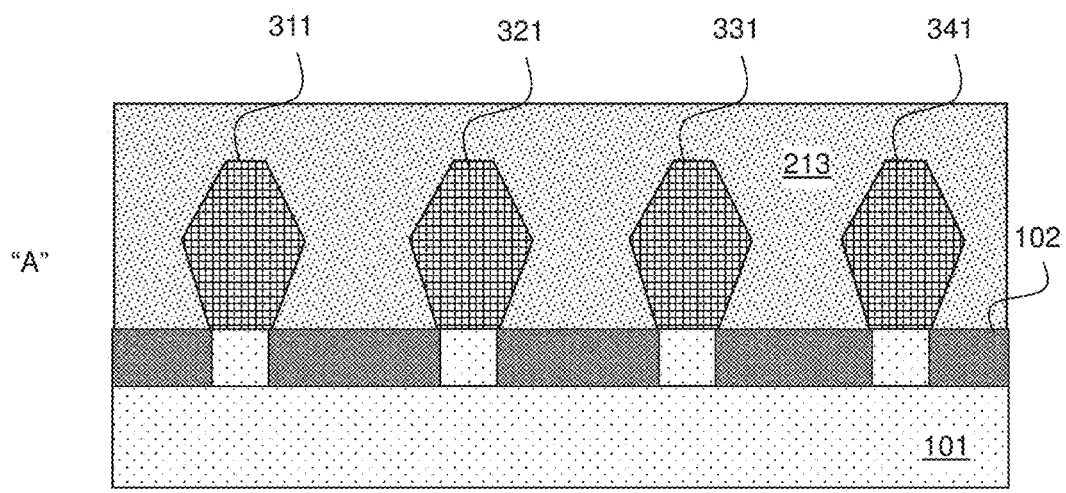
FIGS. 5(a) and 5(b) are demonstrative illustrations of a step of a method of manufacturing a semiconductor device having one or more n-type bulk finFETs, following the step illustrated in FIGS. 4(a) and 4(b), according to an embodiment of present invention.
Figure 5B:
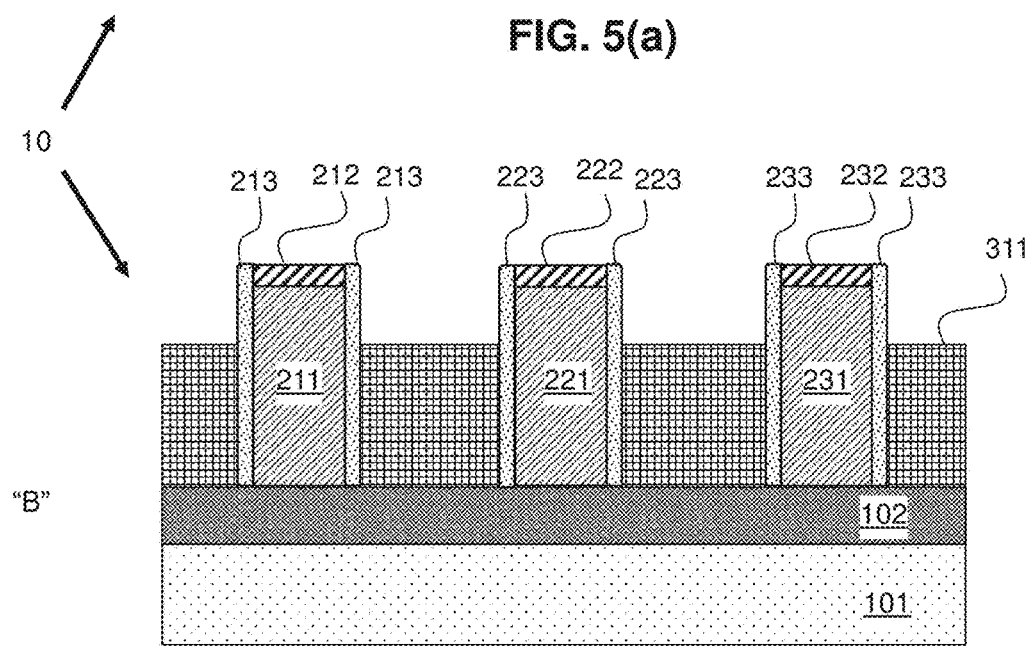

FIGS. 5(a) and 5(b) are demonstrative illustrations of a step of a method of manufacturing a semiconductor device having one or more n-type bulk finFETs, following the step illustrated in FIGS. 4(a) and 4(b), according to an embodiment of present invention. More specifically, the method may include forming fully relaxed source/drain regions, in between the gates, of a first material. The first material may have a lattice constant that is larger than that of a second material which may be used to form a capping layer to cover the source/drain regions later as being described below in more details with reference to FIG. 6(a)-FIG. 7(b). For example, the first material may be silicon-germanium (SiGe) and the second material may be silicon (Si). In such case, the epitaxially formed source/drain regions may have a lattice constant that depends upon the amount or concentration level of germanium (Ge) relative to the amount or concentration level of silicon (Si) used in the epitaxial growth process. Because Ge has a lattice constant that is approximately 4% larger than that of Si, a SiGe so formed with, for example, 50% atomic percentage of germanium content may have a lattice constant that is approximately 2% larger than that of pure Si, and a SiGe formed with 25% atomic percentage of germanium may have a lattice constant approximately 1% larger than that of pure Si. In the below description, as a non-limiting example, SiGe is presumed to be the first material and Si is presumed to be the second material, although other combination of suitable semiconductor materials may be used as well for the first and the second material in the above process.

In the following description, lattice constant of various materials such as SiGe and/or Si, either strained or unstrained, are all referenced in percentage term relative to fully relaxed and unstrained Si crystalline which is defined to have 0% lattice constant (relative to its own). On the other hand, strains in a material may be measured in term of changes in lattice constant relative to its lattice constant at a fully relaxed and unstrained state. For example, for pure Si, a positive lattice constant (a positive percentage) suggests tensile strain in the silicon material while a negative lattice constant (a negative percentage) suggests compressive strain in the same material. Further for example, for SiGe, if lattice constant of the SiGe material (e.g., 2.4%) is larger than the lattice constant of a fully relaxed unstrained SiGe (e.g., 2.0%), the SiGe material is considered to be under tensile strain (of 0.4%). On the other hand, if lattice constant of the SiGe material (e.g., 0.2%) is smaller than that of a fully relaxed unstrained SiGe (e.g., 2.0%), even though it may still be a positive lattice constant (of 0.2%), the SiGe material is considered to be under compressive strain (of −1.8%). Hereinafter, compressive or tensile stain inside a material may be measured by the percentage change in its lattice constant (relative to that of its fully relaxed unstrained state). Lattice constant of a material may be experimentally measured, for example, by applying dual lens dark field electron holography.

As being demonstratively illustrated in FIGS. 5(*a*) and 5(*b*), source/drain regions 311, 321, 331, and 341 may be epitaxially grown from the exposed cross-sections of the fins 111, 121, 131, and 141. In order to achieve fully relaxed SiGe source/drain regions, the SiGe epitaxial growth process may be conditioned or tuned such that a large amount of stacking faults and dislocations may be induced in the formed SiGe source/drain regions. Here, the term "large amount" denotes an amount of stacking faults and dislocations that is high to a point where it is normally considered as undesirable for source/drain regions by a person skilled in the art and is thus generally avoided. The large amount of stacking faults and dislocations may result in fully relaxed SiGe source/drain regions, which enables embodiments of present invention to advantageously introduce a tensile strain in the channel region of the finFET, as being described below in more details with reference to FIG. 6(*a*)-FIG. 7(*b*). Here, it is to be noted that embodiments of present invention may include other method and/or process that may be used to create fully relaxed source/drain regions.

In order to introduce stacking faults and dislocations in the formed source/drain regions, one embodiment of present invention may include introducing a high level of concentration of germanium (Ge) content in the epitaxial growth of SiGe. For example, present invention has experimentally tested and confirmed that a Ge content of as high as 50-53% in atomic percentage may be introduced in the formed SiGe source/drain regions which is found to be accompanied by a high level of stacking faults and dislocations. Present invention also confirms that the existence of stacking faults and dislocations caused by the above results in fully relaxed SiGe source/drain regions, which provides a condition for introducing compressive strains in the source/drain regions through applying external compressive stress. Source/drain regions of SiGe with compressive strains may in-turn create tensile strain in the Si channel regions underneath the gates of the finFETs between the source and drain regions.

An illustrative perspective view of the semiconductor device manufactured by the step shown above in FIGS. 5(*a*) and 5(*b*) may be found in FIG. 10 which demonstratively illustrates the epitaxially grown source/drain regions 311, 321, and 331.

In FIGS. 5(*a*) and 5(*b*), it is demonstratively illustrated that diamond shaped source/drain regions maybe formed through the epitaxial growth process. According to yet another embodiment, the diamond shaped source/drain regions may further be re-shaped, through for example a selective etching process, an ion-sputtering process, or any other currently existing or future developed technique, to have a shape that is substantially similar to that of the cross-section of the fin channel region. One of such shape may be for example a rectangular shape as being demonstratively illustrated in FIGS. 11(*a*) and 11(*b*) as an alternative embodiment. The formation of source/drain regions having a substantially similar shape to that of the fin may further enhance the effect of the source/drain regions exerting tensile stress towards the fin channel region as being described below in more details.

FIGS. 6(*a*) and 6(*b*) are demonstrative illustrations of a step of a method of manufacturing a semiconductor device having one or more n-type bulk finFETs, following the step illustrated in FIGS. 5(*a*) and 5(*b*), according to an embodiment of present invention. After epitaxially forming fully relaxed SiGe source and drain regions, the source/drain regions may be further processed to create internal compressive strain which consequently may result in tensile stress being applied towards the Si fin channel regions covered underneath the gate structures. More specifically, as a non-limiting example of creating internal compressive strain to the source/drain regions, capping layers and particularly silicon capping layers may be formed or created to surround and substantially cover the epitaxially grown source/drain regions. As being demonstratively illustrated in FIG. 6(*a*), silicon cap layers 411, 421, 431, and 441 may be epitaxially grown to encompass underneath source/drain regions 311, 321, 331, and 341 that have inherently large amount of stacking faults and dislocations. The silicon cap layers 411, 421, 431, and 441 may be formed to have a thickness that is sufficiently thick to start creating compressive strain, during their epitaxial formation, inside source/drain regions 311, 321, 331, and 341. For example, the thickness of silicon cap or capping layer may range from about 5 nm to about 30 nm to create adequate compressive stress toward underneath SiGe source/drain regions. At least due to difference in lattice constant between that of the formed Si cap layer and the SiGe source/drain regions covered by the Si cap layer, compressive stain may be created internal to the SiGe source/drain regions. For example, from fully relaxed SiGe with a lattice constant of about 2% larger than that of pure Si, the source/drain regions may become strained to have a lattice constant of about 0.2% (although still larger than that of pure Si), experiencing a net lattice constant change and thus compressive strain of −1.8%.

Figure 12A:
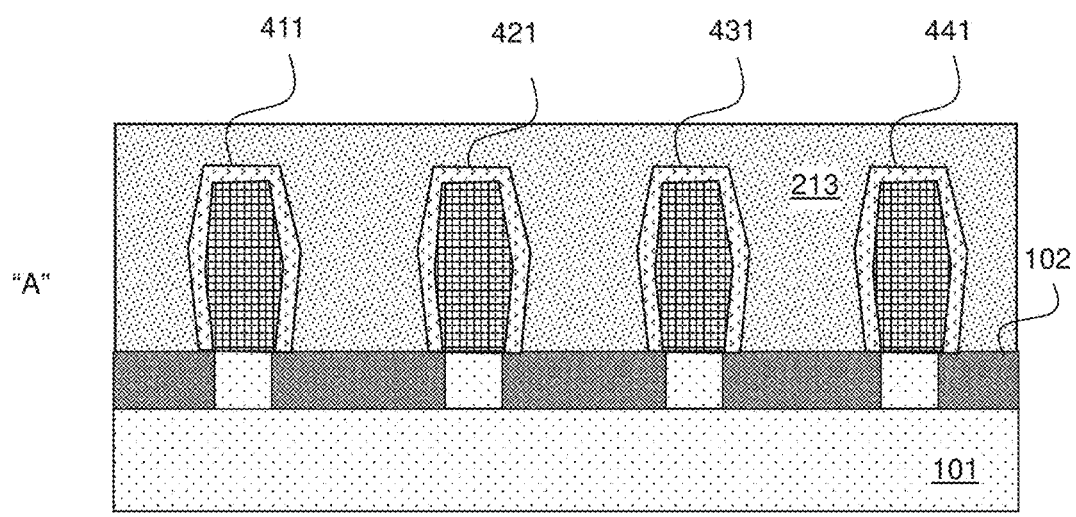
FIGS. 12(a) and 12(b) are demonstrative illustrations of a step of a method of manufacturing a semiconductor device having one or more n-type bulk finFETs, following the step illustrated in FIGS. 11(a) and 11(b), according to another embodiment of present invention.
Figure 12B:
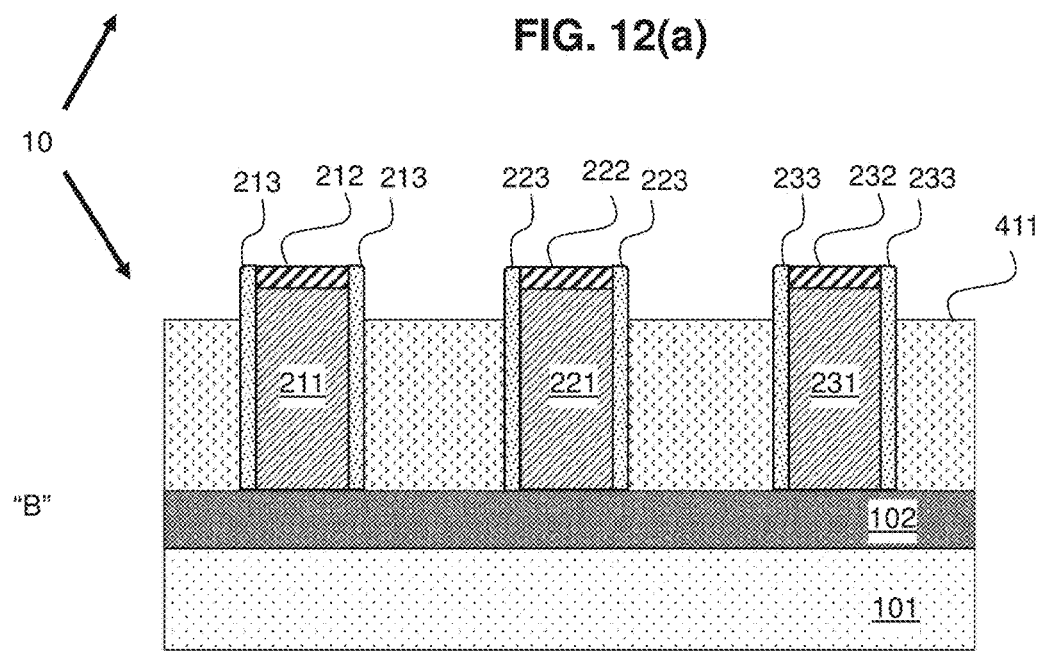

In the alternative embodiment, as being demonstratively illustrated in FIGS. 11(*a*) and 11(*b*), where the SiGe source/drain regions are formed to have shapes substantially similar to that of cross-section of the silicon fin channel region, the silicon capping layers so formed are demonstratively illustrated in FIGS. 12(a) and 12(b) where compressive stresses in the SiGe source/drain regions may be created in areas much closer to the silicon fin channel region, enhancing the effectiveness of the SiGe source/drain regions exerting tensile stress towards the silicon fin channel region.

FIGS. 7(a) and 7(b) are demonstrative illustrations of a step of a method of manufacturing a semiconductor device having one or more n-type bulk finFETs, following the step illustrated in FIGS. 6(a) and 6(b), according to an embodiment of present invention. More specifically, during the formation of silicon cap layer 411, 421, 431, and 441, due to lattice mismatch, the formed silicon cap layer starts to apply compressing stress towards the SiGe source/drain regions that it covers, and the fact of being fully relaxed facilitates the SiGe source/drain regions to "collapse" into sources and drains 312, 322, 332, and 342. This consequently results in applying a pulling effect towards to the Si fin channel regions that are underneath the gate structures and immediately adjacent to the source/drain regions. This pulling effect creates tensile strain inside the Si channel regions, which is generally considered as desirable for increasing mobility of carriers in n-type finFET transistors. In one example, the Si fin channel region was tested to be experiencing at least 0.7% tensile strain due to neighboring SiGe source/drain regions that are under compressive strains.

FIG. 8 is an illustrative perspective view of a step of a method of manufacturing a semiconductor device having one or more n-type bulk finFETs, which closely resembles the step demonstratively illustrated in FIGS. 3(a) and 3(b) as being described above; FIG. 9 is an illustrative perspective view of a step of a method of manufacturing a semiconductor device having one or more n-type bulk finFETs, which closely resembles the step demonstratively illustrated in FIGS. 4(a) and 4(b) as being described above; and FIG. 10 is an illustrative perspective view of a step of a method of manufacturing a semiconductor device having one or more n-type bulk finFETs, which closely resembles the step demonstratively illustrated in FIGS. 5(a) and 5(b) as being described above.

Figure 13A:
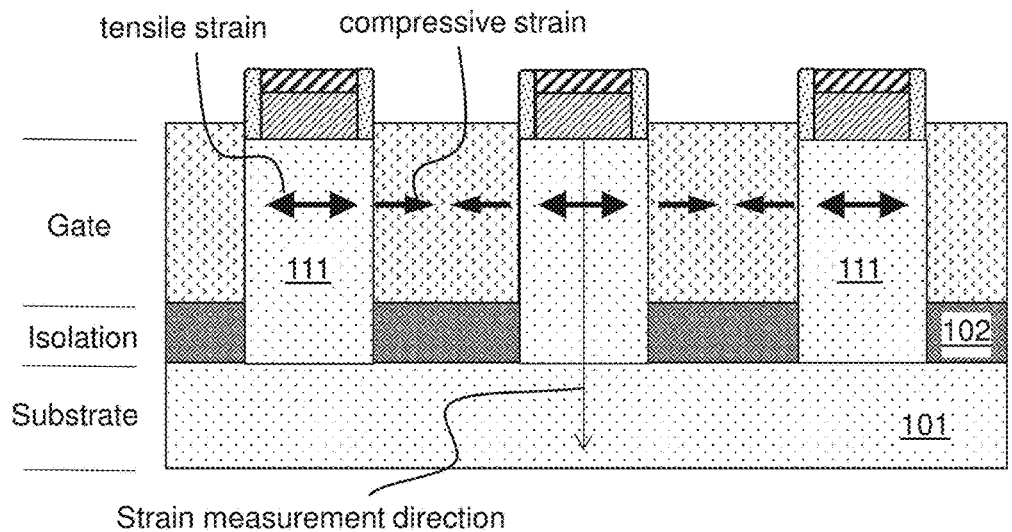
FIG. 13(a) is a demonstrative illustration of strains in the channel, source, and drain regions of n-type bulk finFETs manufactured according to an embodiment of present invention, and FIG. 13(b) are test results of strains as being measured along the vertical direction of the fins.
Figure 13B:
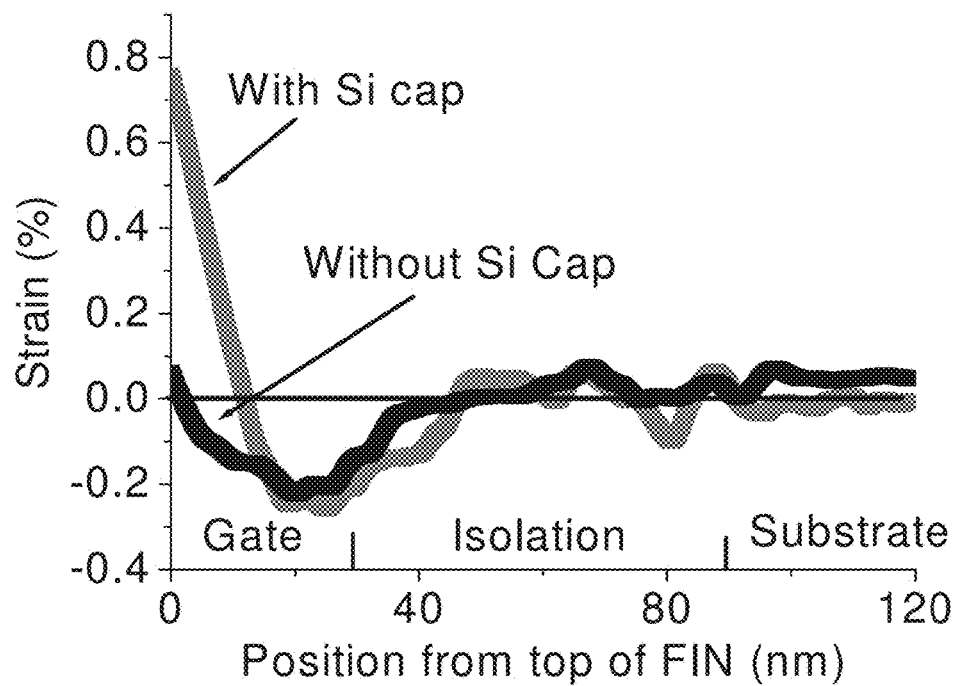

FIG. 13(a) is a demonstrative illustration of strains in the channel, source, and drain regions of n-type bulk finFETs manufactured according to an embodiment of present invention. It is illustrated by different types of arrows that the silicon fin channel regions 111 experiencing tensile strains while the SiGe source/drain regions experiencing compressive strains. FIG. 13(b) are measurement results of strains as being tested along the vertical direction of the fin region of a finFET where its SiGe regions are formed either with Si cap or without Si cap. Measurements were made vertically across regions corresponding to the gate region, the isolation region, and into the substrate region. The test results clearly indicate that with the application of the Si cap layer, the fin channel region experiences an increase in tensile strains, up to 0.7% strain in areas closer to the top of the fins. The strength of the strain decreases along the vertical direction toward the substrate 101.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:
1. A method comprising:
forming a finFET structure having a fin channel region underneath a gate structure, and a source region and a drain region directly adjacent to said fin channel region at two opposing sides of said gate structure, wherein forming said finFET structure includes:
covering a fin on a substrate with said gate structure;
forming sidewall spacers adjacent to sidewalls of said gate structure; and
forming said fin channel region by removing portions of said fin that are not covered by said gate structure and said sidewall spacers; and
subjecting said source region and said drain region to a compressive stress; thereby causing said source region and said drain region to exert a tensile stress to said fin channel region.

2. The method of claim 1, wherein forming said finFET structure comprises epitaxially growing fully relaxed silicon-germanium (SiGe) at said two opposing sides of said fin channel region to form said source region and said drain region, wherein said SiGe of said source region and said drain region has a Ge concentration level of at least 50% in atomic percentage.

3. The method of claim 2, wherein epitaxially growing said fully relaxed SiGe comprises forming said source region and said drain region by growing said SiGe to have stacking faults and dislocations, and using said Ge concentration level to control amount of said stacking faults and dislocations inside said source region and said drain region.

4. The method of claim 1, wherein subjecting said source region and said drain region to said compressive stress comprises epitaxially growing a silicon cap layer on top of and covering said source region and said drain region, wherein said silicon cap layer has a lattice constant that is smaller than that of said source region and said drain region.

5. The method of claim 4, wherein said silicon cap layer has a thickness ranging from about 5 nm to about 30 nm, causing said source region and said drain region to exert a tensile stress to and result in a tensile strain of at least 0.7% in said fin channel region.

6. The method of claim 4, wherein growing said silicon cap layer covering said source region and said drain region causes said source region and said drain region to become a stressed source and drain with a compressive strain of at least −1.8%.

7. A method comprising:
providing a semiconductor substrate with one or more fins on top thereof;
covering a lower portion of said one or more fins in an insulating material;
covering a fin channel region of said one or more fins using a gate structure;
forming sidewall spacers next to two opposing sidewalls of said gate structure;
removing portions of said one or more fins that are not covered by said gate structure and not covered by said sidewall spacers, thereby exposing cross-sections of said one or more fins at surfaces of said sidewall spacers and said insulating material;
epitaxially growing silicon-germanium (SiGe) from said exposed cross-sections of said one or more fins to form a source region and a drain region directly adjacent to said fin channel region at two opposing sides of said gate structure; and
subjecting said source region and said drain region to a compressive stress; thereby causing said source region and said drain region to exert a tensile stress to said fin channel region.

8. The method of claim 7, wherein epitaxially growing said SiGe comprises forming said source region and said drain region by said SiGe to have stacking faults and dislocations, and using a Ge concentration level in said SiGe of at least 50% in atomic percentage to control amount of said stacking faults and dislocations inside said source region and said drain region.

9. The method of claim 7, wherein subjecting said source region and said drain region to said compressive stress comprises epitaxially growing a silicon cap layer on top of and covering said source region and said drain region, wherein said silicon cap layer, during a course of formation thereof, applies said compressive stress towards said source region and said drain region of which said silicon cap layer encompasses.

10. The method of claim 9, wherein said silicon cap layer has a thickness ranging from about 5 nm to about 30 nm, said thickness being sufficient to cause said source region and said drain region to be pulled in a direction away from said fin channel region thereby resulting in a tensile strain of at least 0.7% inside said fin channel region.

11. The method of claim 9, wherein growing said silicon cap layer covering said source region and said drain region causes said source region and said drain region to become stressed source and drain of a finFET with a compressive strain of at least −1.8%.

\* \* \* \* \*